United States Patent
Cheng et al.

(10) Patent No.: US 9,502,493 B2
(45) Date of Patent: Nov. 22, 2016

(54) MULTI-STEP METHOD OF FORMING A METAL FILM

(71) Applicant: Taiwan Semiconductor Manufacturing Co., Ltd., Hsin-Chu (TW)

(72) Inventors: Kai-Wen Cheng, Taichung (TW); Cheng-Yuan Tsai, Chu-Pei (TW); Chia-Shiung Tsai, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 74 days.

(21) Appl. No.: 14/190,392

(22) Filed: Feb. 26, 2014

(65) Prior Publication Data

US 2015/0243730 A1   Aug. 27, 2015

(51) Int. Cl.
| | | |
|---|---|---|
| *H01L 49/02* | (2006.01) | |
| *H01L 23/522* | (2006.01) | |
| *H01L 23/532* | (2006.01) | |
| *H01L 21/285* | (2006.01) | |
| *H01L 21/3205* | (2006.01) | |
| *H01L 21/768* | (2006.01) | |

(52) U.S. Cl.
CPC .......... *H01L 28/75* (2013.01); *H01L 21/2855* (2013.01); *H01L 21/32051* (2013.01); *H01L 21/76841* (2013.01); *H01L 23/5223* (2013.01); *H01L 23/53257* (2013.01); *H01L 2924/0002* (2013.01)

(58) Field of Classification Search
CPC .................. H01L 2924/0002; H01L 2924/00; H01L 21/0276; H01L 21/28518; H01L 21/76805; H01L 21/76814; H01L 21/76838; H01L 21/7685; H01L 21/76888; H01L 2221/1078; H01L 23/53223; H01L 27/0805; H01L 27/24; H01L 28/40; H01L 28/90; H01L 21/31683

USPC ................. 257/E21.029, E21.165, E21.438, 257/E21.582, E29.255, E29.343, 4, 532, 257/E21.008; 438/592, 636, 648, 656, 671, 438/682, 685, 368, 393

See application file for complete search history.

(56) References Cited

U.S. PATENT DOCUMENTS

| | | | |
|---|---|---|---|
| 5,759,916 A * | 6/1998 | Hsu ................... | H01L 21/76838 257/E21.029 |
| 5,874,355 A | 2/1999 | Huang et al. | |
| 2004/0097060 A1* | 5/2004 | San ................... | H01L 21/28518 438/592 |
| 2008/0268605 A1* | 10/2008 | Ahn ....................... | C23C 16/308 438/386 |
| 2009/0053538 A1* | 2/2009 | Ma .................... | H01L 21/76805 428/457 |
| 2012/0211865 A1* | 8/2012 | Tian ................... | H01L 27/0805 257/532 |
| 2013/0221315 A1* | 8/2013 | Wang .................... | H01L 45/08 257/4 |

FOREIGN PATENT DOCUMENTS

WO        0221593 A2    3/2002

* cited by examiner

*Primary Examiner* — William F Kraig
*Assistant Examiner* — Edward Chin
(74) *Attorney, Agent, or Firm* — Eschweiler & Associates, LLC

(57) ABSTRACT

The present disclosure relates to an integrated chip having a titanium nitride film that provides for a reduced leakage path, and an associated method of formation. In some embodiments, the integrated chip comprises a semiconductor substrate. A titanium nitride film is disposed over the semiconductor substrate. The titanium nitride film comprises a plurality of titanium nitride layers having grain boundaries abutting vertical column-like structures of titanium nitride. The grain boundaries are discontinuous between a top surface of the titanium nitride film and a bottom surface of the titanium nitride film. The discontinuity of the grain boundaries between the different titanium nitride layers reduces leakage paths through the titanium nitride film (e.g., and thereby can improve operation of a MIM capacitor having titanium nitride electrodes).

20 Claims, 4 Drawing Sheets

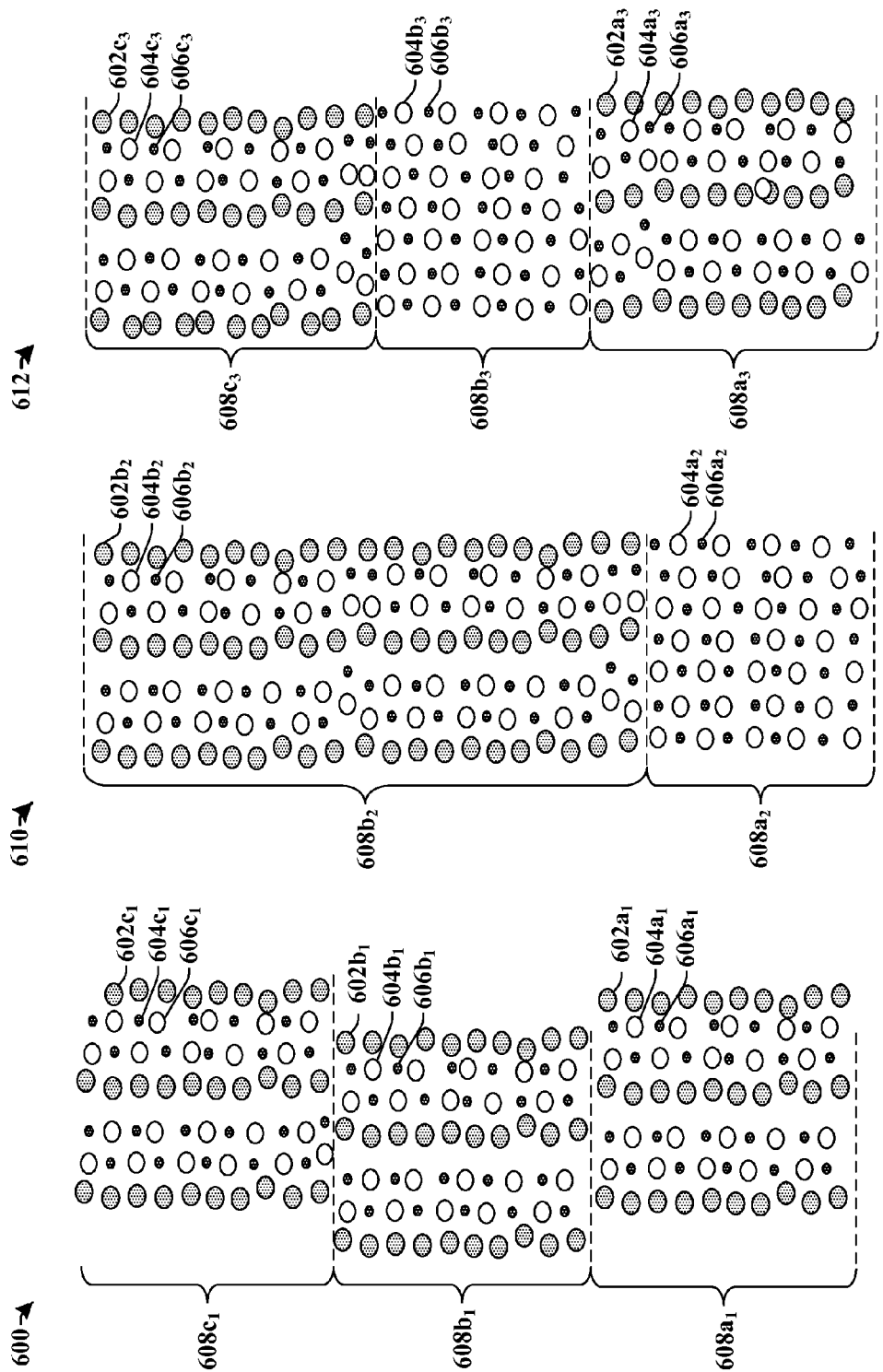

MULTI-STEP METHOD OF FORMING A METAL FILM

BACKGROUND

As dimensions of integrated chip circuit components continue to be reduced, the materials used to fabricate such components play an increasingly important role in the performance of such components. In recent years, titanium nitride (TiN) films have become a widely used material in integrated chip components. For example, titanium nitride films may be used in making vertical interconnects that electrically connect a metal interconnect layer to an underlying transistor device within a substrate. Titanium nitride films may also be used as a barrier layer that separates a metal interconnect layers (e.g., a metal interconnect comprising copper, tungsten, aluminum) from a surrounding inter-level dielectric material having a low dielectric constant (low k). The barrier layer minimizes the diffusion of interconnect metal into the insulating material, which can degrade the electrical performance of the integrated chip circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A-6C illustrate some embodiments of schematic illustrations of titanium nitride films formed according to the method of FIG. 5.

DETAILED DESCRIPTION

Figure 1:
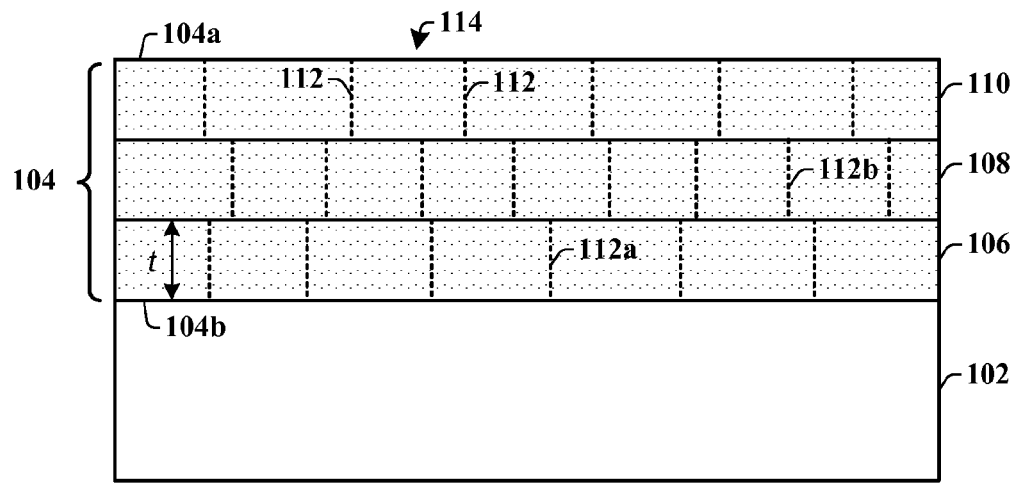
FIG. 1 illustrates a cross-sectional view of some embodiments of titanium nitride film comprising a plurality of titanium nitride layers having distinct crystallization patterns with discontinuous grain boundaries.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Titanium nitride films are one of the most widely used materials in modern CMOS integrated chips. Titanium nitride films are typically formed onto a substrate using a vapor deposition process, such as PVD (physical vapor deposition), CVD (chemical vapor deposition), or MOCVD (metal-organic chemical vapor deposition). Such vapor deposition processes form a titanium nitride film using a single step growth process, which continually deposits titanium nitride onto a substrate until the titanium nitride film is completed.

It has been appreciated that the use of titanium nitride films as electrodes in a MIM (metal-insulator-metal) capacitor can improve operation of the MIM capacitor (e.g., allows for the MIM capacitor have a greater capacitance). However, it has also been appreciated that the use of a single step growth process can result in regular column-structures in a titanium nitride film. For example, when a titanium nitride is formed thicker, the titanium nitride films forms itself as columnar structures with gaps in between the columns. The gaps (called grain boundaries) provide for a possible leakage path, which may allow for the diffusion of copper (Cu) along titanium nitride grain boundaries (e.g., during etching of a via hole above a titanium nitride film).

Accordingly, the present disclosure relates to an integrated chip having a titanium nitride film having a plurality of layers with discontinuous grain boundaries that form a reduced leakage path, and an associated method of formation. In some embodiments, the integrated chip comprises a semiconductor substrate. A titanium nitride film is disposed over the semiconductor substrate. The titanium nitride film comprises a plurality of titanium nitride layers having grain boundaries abutting vertical column-like structures of titanium nitride. The grain boundaries between adjacent titanium nitride layers are discontinuous, so that the grain boundaries do not continuously extend between a top surface of the titanium nitride film and a bottom surface of the titanium nitride film. The discontinuity of the grain boundaries between the different titanium nitride layers reduces leakage paths through the titanium nitride film (e.g., and thereby can improve operation of a MIM capacitor having titanium nitride electrodes).

FIG. 1 illustrates some embodiments of a cross-sectional view 100 of a titanium nitride film 104 comprising a plurality of titanium nitride layers having distinct crystallization patterns with discontinuous grain boundaries.

The titanium nitride film 104 comprises a plurality of titanium nitride layers 106-110 disposed over a semiconductor substrate 102. For example, titanium nitride film 104 comprises a first titanium nitride layer 106, a second titanium nitride layer 108, and a third titanium nitride layer 110. In some embodiments, respective titanium nitride layers may have a thickness in a range of between approximately 100 angstrom and approximately 200 angstrom. In some embodiments, the titanium nitride film 104 may comprise a number of titanium nitride layers that are sufficient to achieve a desired total thickness for the titanium nitride film 104. For example, 8 titanium nitride layers having a thickness of 100 angstrom would result in a titanium nitride film 104 having a thickness of 800 angstrom.

The plurality of titanium nitride layers 106-110 have different crystallization patterns comprising column-like structures 114 that abut grain boundaries 112. The column-like structures form when titanium nitride being deposited onto the semiconductor substrate 102 forms itself as column-like structures 114 with gaps or 'grain boundaries' 112 in between the columns. The different crystallization patterns cause the grain boundaries 112 caused by the column-like structures to be discontinuous such that the grain boundaries 112 do not extend continuously between a top surface 104a of the titanium nitride film 104 and a bottom surface 104b of the titanium nitride film 104. For example, in some embodiments, the different crystallization patterns cause the grain boundaries 112 to be located at different lateral positions within adjacent titanium nitride layers (e.g., 106 and 108).

For example, the first titanium nitride layer 106 has a first crystallization pattern that provides for a first grain boundary 112a at a first location. The first grain boundary 112a extends vertically within the first titanium nitride layer 106. The second titanium nitride layer 108 has a second crystallization pattern that provides for a second grain boundary 112b at a second location, laterally displaced from the first location. The second grain boundary 112b extends vertically within the second titanium nitride layer 108. Since the location of the second grain boundary 112b is laterally displaced from the location of the first grain boundary 112a, the resulting titanium nitride film 104 does not have grain boundaries that extend along an entire vertical height of the titanium nitride film 104.

Therefore, while metal may diffuse along the grain boundaries 112, by causing the grain boundaries 112 to form at different lateral positions within adjacent titanium nitride layers the plurality of titanium nitride layers 106-110 prevent the grain boundaries from vertically extending along an entire vertical height of the titanium nitride film 104. By preventing the grain boundaries from extending along an entire vertical height of the titanium nitride film 104, metal diffusion through the titanium nitride film 104 is prevented.

Figure 2:
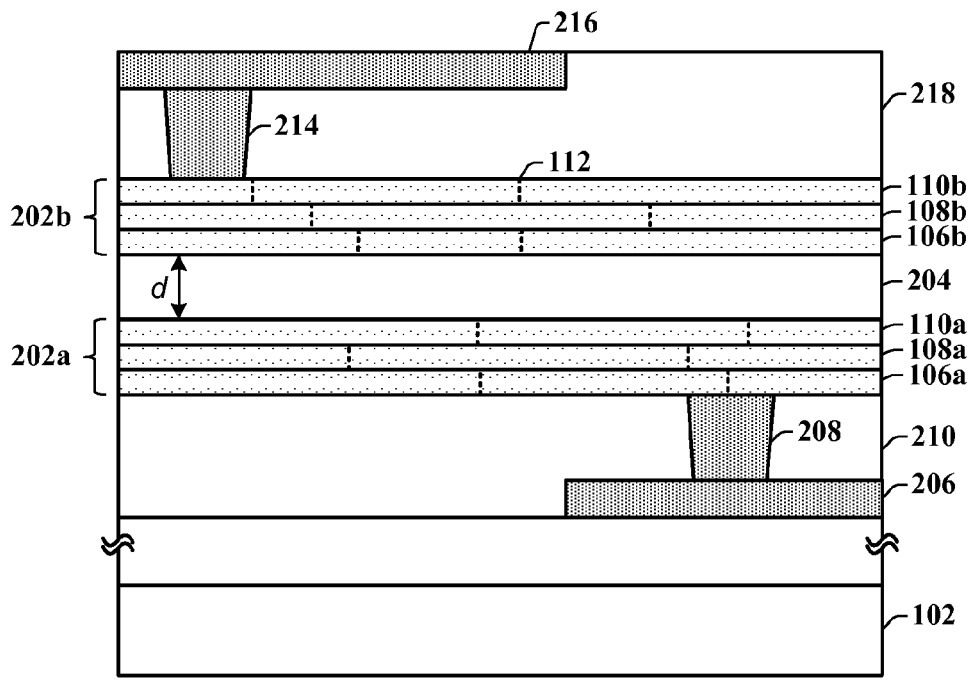
FIG. 2 illustrates a cross-sectional view of some embodiments of MIM capacitor having a titanium nitride film comprising a plurality of titanium nitride layers having discontinuous grain boundaries.

FIG. 2 illustrates a cross-sectional view of some embodiments of MIM capacitor 200 having a first and electrode and a second electrode comprising titanium nitride films with a plurality of titanium nitride layers having discontinuous grain boundaries.

The MIM (metal-insulator-metal) capacitor 200 comprises an insulator layer 204 is disposed between a first titanium nitride electrode 202a and a second titanium nitride electrode 202b. The MIM capacitor 200 has a capacitance value that is proportionate to a dielectric value of the insulator layer 204 and that is inversely proportionate to a distance d between the first titanium nitride electrode 202a and the second titanium nitride electrode 202b.

The first titanium nitride electrode 202a comprises a first titanium nitride film disposed over a semiconductor substrate 102. The first titanium nitride film has a plurality of titanium nitride layers 106a-110a disposed on top of one another (e.g., a second titanium nitride layer 108a disposed over a first titanium nitride layer 106a, and a third titanium nitride layer 110a disposed over a second titanium nitride layer 108a). In some embodiments, the first titanium nitride layer 106a may vertically abut a first metal via layer 208. The first metal via layer 208 is configured to provide an electrical connection between the titanium nitride TiN electrode 202a a first metal interconnect layer 206 disposed within a first dielectric layer 210.

The second titanium nitride electrode 202b comprises a second titanium nitride film separated from the first titanium nitride electrode 202a by the insulator layer 204. The second TiN film has a plurality of titanium nitride layers 106b-110b disposed on top of one another. In some embodiments, the second TiN electrode 202b may vertically abut a second metal via layer 214. The second metal via layer 214 is configured to provide an electrical connection between the second TiN electrode 202b and a second metal interconnect layer 216 disposed within a second dielectric layer 218.

By causing the grain boundaries 112 within the first and second titanium nitride electrodes, 202a and 202b, to be discontinuous along a vertical height of the electrodes, diffusion of metal atoms (e.g., copper) along the grain boundaries and into the insulator layer 204 is prevented. Preventing the diffusion of metal atoms into the insulator layer 204 results in a MIM capacitor 200 having a reduced average leakage current. For example, using titanium nitride electrodes having two titanium nitride layers can reduce the average leakage current by between approximately 20% and approximately 30% relative to using titanium nitride electrodes having a single titanium nitride layer. Using titanium nitride electrodes having three titanium nitride layers can further reduce the average leakage current by between approximately 30% and approximately 40% relative to using titanium nitride electrodes having a single titanium nitride layer.

Figure 3A:
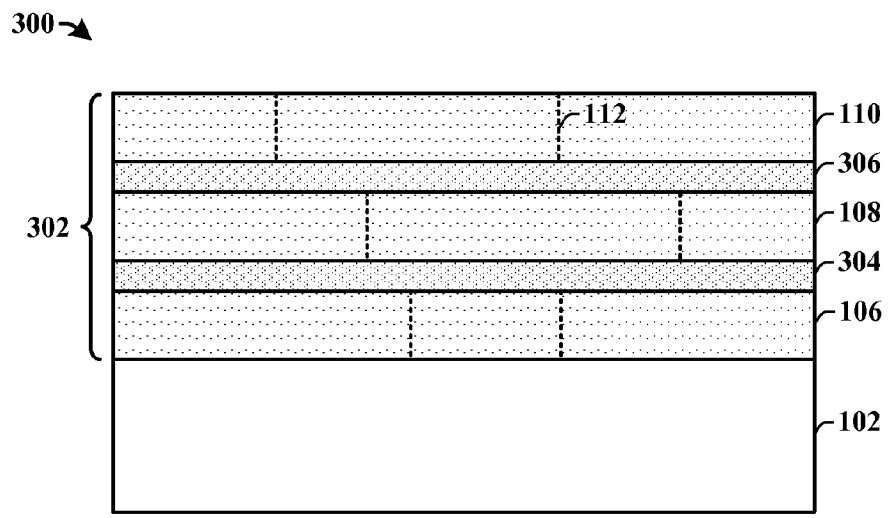
FIG. 3A illustrates a cross-sectional view of some embodiments of titanium nitride film comprising a plurality of titanium nitride layers separated by metal inter-layers.

FIG. 3A illustrates some embodiments of a cross-sectional view 300 of a titanium nitride film 302 comprising a plurality of titanium nitride layers separated by metal inter-layers.

The titanium nitride film 302 comprises a plurality of titanium nitride layers 106-110 disposed over a semiconductor substrate 102. The semiconductor substrate 102 may comprise any type of semiconductor body (e.g., silicon, silicon-germanium, silicon-on-insulator) as well as any other type of semiconductor and/or epitaxial layers associated therewith. The plurality of titanium nitride layers 106-110 have different crystallization patterns comprising column like structures that respectively abut grain boundaries 112.

Metal inter-layers, 304 and 306, are disposed between the plurality of titanium nitride layers 106-110. For example, a first metal inter-layer 304 is disposed between a first titanium nitride layer 106 and a second titanium nitride layer 108. Similarly, a second metal inter-layer 306 is disposed between the second titanium nitride layer 108 and a third titanium nitride layer 110. The metal inter-layers, 304 and 306, separate the grain boundaries 112 within adjacent titanium nitride layers (e.g., 106 and 108), so as to form discontinuous grain boundaries along a height of the titanium nitride film 302.

In some embodiments, the metal inter-layers, 304 and 306, may comprise titanium, so that the titanium nitride film 302 comprises titanium nitride layers interleaved with titanium inter-layers. In such embodiments, a ratio of titanium to nitride (Ti/N) for the titanium nitride film 302 is greater than 1.03 (in contrast to typical TiN films, which have a Ti/N ratio of between 1.00 and 1.03). In other embodiments, the metal inter-layers, 304 and 306, may comprise other materials. For example, the metal inter-layers, 304 and 306, may comprise aluminum, copper, or some other conductive material.

Figure 3B:
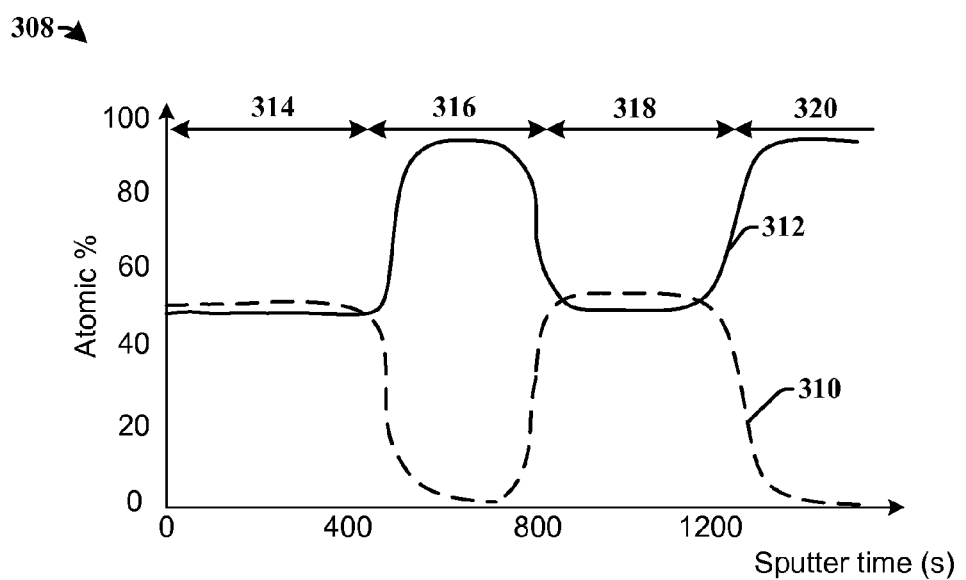
FIG. 3B illustrates a graph showing some embodiments of an exemplary XPS depth profile of a titanium nitride film comprising a plurality of titanium nitride layers separated by titanium inter-layers.

FIG. 3B illustrates some embodiments of an exemplary x-ray photoelectron spectroscopy (XPS) depth profile 308 of a titanium nitride film 302 having titanium inter-layers. The XPS depth profile 308 shows the elemental composition of the titanium nitride film 302 as a function of depth. For example, the XPS depth profile 308 may be obtained by combining a sequence of ion gun etch cycles interleaved with XPS measurements (e.g., an ion gun is used to etch a titanium nitride film for a period of time before being turned off while XPS spectra are acquired).

The XPS depth profile 308 illustrates that the titanium content 310 and the nitrogen content 312 of the titanium nitride film 302 as a function of depth. The titanium content 310 shows peaks at the locations of the titanium inter-layers, while the nitrogen content 312 shows corresponding valleys at the locations of the titanium inter-layers. For example, the regions, 314 and 318, where the titanium content 310 and the nitrogen content 312 are similar indicates a titanium nitride layer is present, while the regions, 316 and 320, where the titanium content 310 is a peak and the nitrogen content 312 is a valley indicates a titanium layer is present.

Figure 4:
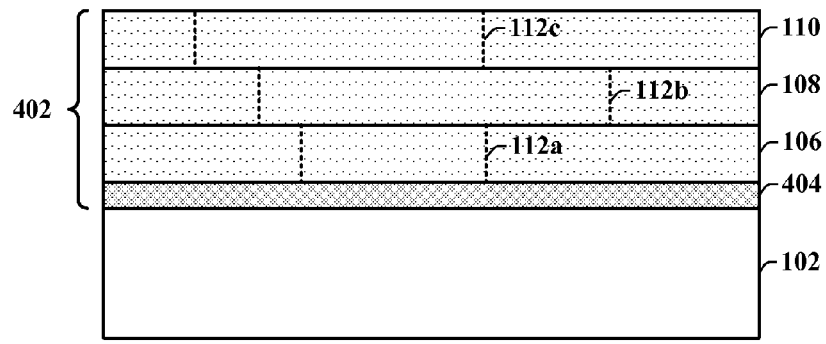
FIG. 4 illustrates a cross-sectional view of some embodiments of titanium nitride film comprising a metal under-layer underlying a plurality of titanium nitride layers.

FIG. 4 illustrates some embodiments of a cross-sectional view 400 of a titanium nitride film 402 comprising a plurality of titanium nitride layers 106-110 disposed over a metal under-layer 404.

The titanium nitride film 402 comprises a plurality of titanium nitride layers 106-110 having different crystallization patterns with column like structures that respectively abut grain boundaries 112. A metal under-layer 404 is disposed between the semiconductor substrate 102 and the plurality of titanium nitride layers 106-110. The metal under-layer 404 separates the grain boundaries 112 within the plurality of titanium nitride layers 106-110 from an underlying layer (e.g., an insulator layer) so that the grain boundaries are discontinuous along a height of the titanium nitride film 402. In some embodiments, the metal under-layer 404 may comprise titanium. In such embodiments, the titanium nitride film 402 comprises a titanium layer disposed below the plurality of titanium nitride layers 106-110. In other embodiments, the metal under-layer 404 may comprise other materials (e.g., aluminum, copper, or some other conductive material).

Figure 5:
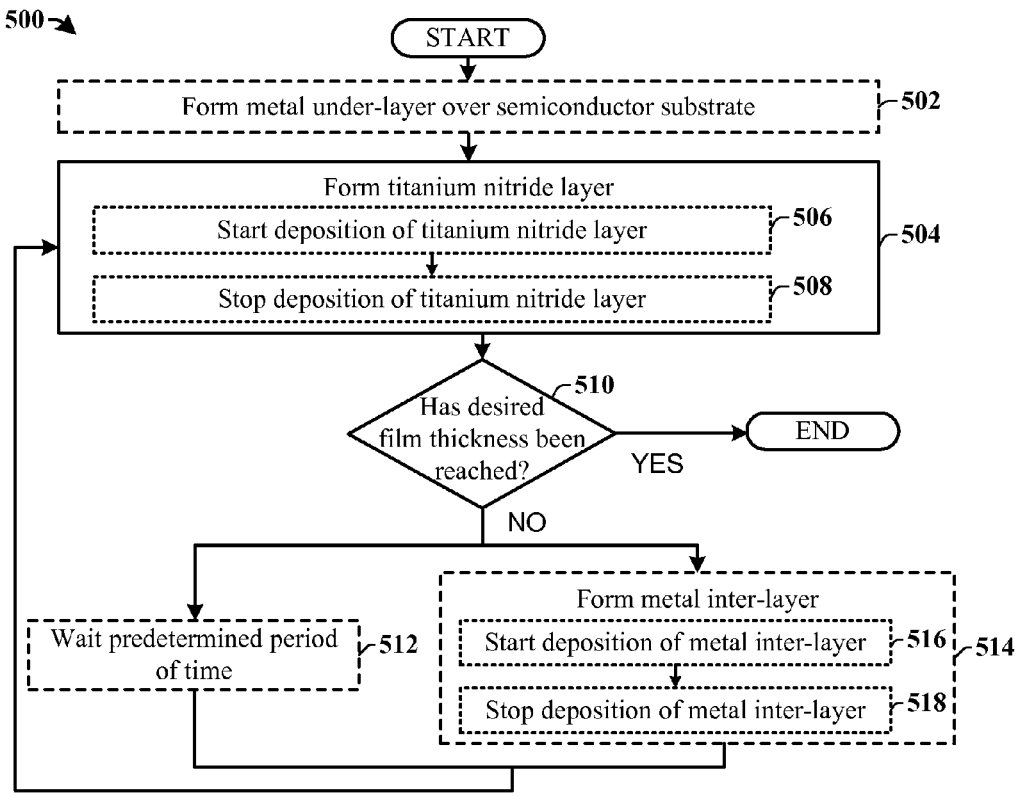
FIG. 5 illustrates a flow diagram of some embodiments of a method of forming a titanium nitride film comprising a plurality of titanium nitride layers having distinct crystallization patterns with discontinuous grain boundaries.

FIG. 5 illustrates a flow diagram of some embodiments of a method 500 of forming a titanium nitride metal film comprising a plurality of titanium nitride layers having distinct crystallization patterns.

While method 500 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 502, a metal under-layer may be formed over a semiconductor substrate, in some embodiments.

At 504, a first titanium nitride layer is formed over the semiconductor substrate.

In some embodiments, the first titanium nitride layer may be formed by starting a deposition of a titanium nitride layer, at 506, and by stopping the deposition of the titanium nitride layer, at 508. In some embodiments, the first titanium nitride layer may be formed onto the metal under-layer. In some embodiments, the deposition may be started by providing power to a vapor deposition tool. In some embodiments, the deposition may be stopped by removing power from (e.g., turning off a power supply) the vapor deposition tool. By turning off power from the vapor deposition tool, deposition of the first titanium nitride layer stops, and the crystal structure of the titanium nitride film is broken.

At 510, the method 500 determines if a desired thickness of the titanium nitride film has been achieved. If a desired thickness has been achieved the method 500 ends. However, if a desired thickness has not been achieved the method 500 proceeds to either act 512 or act 514, in various embodiments.

At 512, after the deposition of the first titanium nitride layer is stopped, the method 500 may wait a predetermined period of time and then start a deposition of another titanium nitride layer (e.g., re-start power to the deposition tool at act 506) to form a second layer of titanium nitride onto the first layer of titanium nitride. In some embodiments, the predetermined period of time may have a range of between approximately 3 seconds and approximately 5 seconds.

At 514, after the deposition of the titanium nitride layer is stopped a metal inter-layer may be formed onto the titanium nitride layer, at 514. In some embodiments, the metal inter-layer may be formed by starting deposition of the metal interlayer at 516 and by stopping deposition of the metal interlayer, at 518. In some embodiments, the metal inter-layer may comprise a titanium layer. In other embodiments, the metal inter-layer may comprise a different material (e.g., aluminum).

It will be appreciated that method 500 may be iteratively performed (e.g., 5 times, 10 times, etc.) to form a plurality of titanium nitride layers until a desired thickness of a titanium nitride film is achieved.

FIGS. 6A-6C illustrate some embodiments of schematic illustrations of titanium nitride films formed according to the method of FIG. 5.

FIG. 6A illustrates some embodiments of the formation of a titanium nitride film 600 having a plurality of titanium nitride layers $608a_1$-$608c_1$.

The titanium nitride film 600 comprises a first titanium nitride layer $608a_1$, a second titanium nitride layer $608b_1$, and a third titanium nitride layer $608c_1$. The first titanium nitride layer $608a_1$ has a first leakage path $602a_1$ that extends between nitrogen molecules $604a_1$ and titanium molecules $606a_1$. The second titanium nitride layer $608b_1$ has a second leakage path $602b_1$ that is not laterally aligned with the first leakage path $602a_1$ of the first titanium nitride layer $608a_1$. The third titanium nitride layer $608c_1$ has a third leakage path $602c_1$ that is not laterally aligned with the second leakage path $602b_1$ of the second titanium nitride layer $608b_1$. Since the leakage paths $602a_1$-$602c_1$ are not laterally aligned, a continuous leakage path does not extend along an entire height of the titanium nitride film 600.

In some embodiments, the first titanium nitride layer $608a_1$ may be formed by providing a working gas and a reactive gas to a processing chamber. In some embodiments, the working gas may comprise argon (Ar) and the reactive gas may comprise nitrogen ($N_2$). After formation of the first titanium nitride layer $608a_1$, deposition of titanium nitride is stopped for a predetermined period of time and then deposition is restarted to form the second titanium nitride layer $608b_1$. After formation of the second titanium nitride layer $608b_1$, deposition of titanium nitride is stopped for a predetermined period of time and then deposition is restarted to form the third titanium nitride layer $608c_1$. By starting and stopping the deposition of titanium nitride, the titanium nitride layers $608c_1$-$608c_1$ are formed with discontinuous grain boundaries.

FIG. 6B illustrates some alternative embodiments of the formation of a titanium nitride film 610 having a plurality of titanium nitride layers $608a_2$-$608b_2$.

The titanium nitride film 610 comprises a titanium metal under-layer $608a_2$ and a first titanium nitride layer $608b_2$. The titanium metal under-layer $608a_2$ comprises nitrogen molecules $604a_2$ and titanium molecules $606a_2$ but does not comprise a leakage path. The first titanium nitride layer $608b_2$ has a leakage path $602b_2$ that extends between nitrogen molecules $604b_2$ and titanium molecules $606b_2$. Since the titanium metal under-layer $608a_2$ does not have a leakage path, a continuous leakage path does not extend along an entire height of the titanium nitride film 600.

In some embodiments, the titanium under-layer $608a_2$ may be formed by adding a working gas comprising argon (Ar) into a processing chamber. After a predetermined period of time (e.g., between approximately 2 seconds and approximately 60 seconds), nitrogen gas ($N_2$) is further added to the processing chamber. The nitrogen gas reacts with the argon gas to form the first titanium nitride layer $608b_2$ over the metal under-layer $608a_2$. The metal under-layer $608a_2$ effectively stops the column-crystal growth and prevent grain boundaries from contacting an underlying material (e.g., an insulator layer).

FIG. 6C illustrates some alternative embodiments of the formation of a titanium nitride film 612 having a plurality of titanium nitride layers $608a_3$-$608c_3$.

The titanium nitride film 612 comprises a first titanium nitride layer $608a_3$, a first titanium inter-layer $608b_3$, and a second titanium nitride layer $608c_3$. The first titanium nitride layer $608a_3$ has a first leakage path $602a_3$ that extends between nitrogen molecules $604a_3$ and titanium molecules $606a_3$. The titanium inter-layer $608b_3$ comprises nitrogen molecules $604b_3$ and titanium molecules $606b_3$ but does not comprise a leakage path. The second titanium nitride layer $608c_3$ has a second leakage path $602c_3$ that extends between nitrogen molecules $604c_3$ and titanium molecules $606c_3$.

In some embodiments, the first titanium nitride layer $608a_1$ may be formed by providing a working gas and a reactive gas to a processing chamber. In some embodiments, the working gas may comprise argon (Ar) and the reactive gas may comprise nitrogen ($N_2$). After formation of the first titanium nitride layer $608a_3$, the nitrogen gas ($N_2$) may be removed from the processing chamber causing the titanium inter-layer $608b_3$ to be formed onto the first titanium nitride layer $608a_3$. After a predetermined period of time (e.g., between approximately 2 seconds and approximately 60 seconds), nitrogen gas ($N_2$) is re-introduced into the processing chamber. The nitrogen gas reacts with the argon gas to form the second titanium nitride layer $608b_2$ over the titanium inter-layer $608b_3$. The titanium inter-layer $608b_3$ effectively stops the column-crystal growth and prevent grain boundaries from contacting an underlying material (e.g., an insulator layer).

Therefore, the present disclosure relates to an integrated chip having a titanium nitride film having a plurality of layers with discontinuous grain boundaries that form a reduced leakage path, and an associated method of formation.

In some embodiments, the present disclosure relates to an integrated chip. The integrated chip comprises a semiconductor substrate. The integrated chip further comprises a titanium nitride film disposed over the semiconductor substrate and comprising a plurality of titanium nitride layers having grain boundaries abutting vertical column-like structures of titanium nitride. The grain boundaries are discontinuous between a top surface of the titanium nitride film and a bottom surface of the titanium nitride film.

In other embodiments, the present disclosure relates to an integrated chip capacitor. The capacitor comprises a first MIM capacitor electrode disposed over a semiconductor substrate and comprising a first titanium nitride film having a first plurality of layers with different crystallization patterns that prevent grain boundaries within the first titanium nitride film from extending along a height of the first titanium nitride film. The capacitor further comprises an insulator layer disposed over the first MIM capacitor electrode. The capacitor further comprises a second MIM capacitor electrode disposed over the insulator layer and comprising a second titanium nitride film having a second plurality of layers with different crystallization patterns that prevent grain boundaries within the second titanium nitride film from extending along a height of the second titanium nitride film.

In yet other embodiments, the present disclosure relates to a method of forming a titanium nitride film. The method comprises starting a deposition of titanium nitride to form a first titanium nitride layer having a first crystal structure over a semiconductor substrate. The method further comprises stopping the deposition of the titanium nitride. The method further comprises re-starting the deposition of the titanium nitride to form a second titanium nitride layer having a second crystal structure, wherein the first and second crystal structures have different crystallization patterns that cause the grain boundaries to form at different lateral positions within the first and second titanium nitride layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. An integrated chip, comprising:
a semiconductor substrate; and
a titanium nitride film disposed over the semiconductor substrate and comprising a plurality of titanium nitride layers contacting one another and respectively having grain boundaries abutting vertical column-like structures of titanium nitride, wherein the grain boundaries are laterally discontinuous between a top surface of the titanium nitride film and a bottom surface of the titanium nitride film, wherein the plurality of titanium nitride layers comprise:
a first titanium nitride layer having a first plurality of grain boundaries, wherein the first plurality of grain boundaries comprise a first grain boundary separating a first vertical column-like structure within the first titanium nitride layer from a second vertical column-like structure within the first titanium nitride layer; and a second titanium nitride layer disposed onto the first titanium nitride layer, wherein the second titanium nitride layer includes a second plurality of grain boundaries that are discontinuous with the first plurality of grain boundaries; and wherein the first grain boundary contacts a lower surface of the second titanium nitride layer at one or more positions that are discontinuous with the second plurality of grain boundaries.

2. The integrated chip of claim 1, wherein the titanium nitride film further comprises a metal under-layer that is not titanium nitride, and wherein the metal under-layer is disposed between the semiconductor substrate and the plurality of titanium nitride layers.

3. The integrated chip of claim 2, wherein the metal under-layer is titanium.

4. The integrated chip of claim 1, wherein the titanium nitride film comprises a first MIM capacitor electrode that abuts an insulator layer disposed between the first MIM capacitor electrode and a second MIM capacitor electrode.

5. The integrated chip of claim 1, wherein the titanium nitride film has a ratio of titanium to nitride that is greater than 1.03.

6. The integrated chip of claim 1, wherein the titanium nitride film continuously extends in a vertical direction between the top surface of the titanium nitride film and the bottom surface of the titanium nitride film.

7. The integrated chip of claim 1, wherein the first titanium nitride layer has a first vertical column-like structure, and the second titanium nitride layer has a second vertical column-like structure that overlies the first vertical column-like structure and laterally straddles one or more sidewalls of the first vertical column-like structure.

8. An integrated chip capacitor, comprising:
a first MIM capacitor electrode disposed over a semiconductor substrate and comprising a first titanium nitride film having a first plurality of layers, wherein at least two layers of the first plurality of layers are titanium nitride layers contacting one another, and wherein the at least two titanium nitride layers of the first plurality of layers have different crystallization patterns that prevent grain boundaries within the first titanium nitride film from extending along a height of the first titanium nitride film;
an insulator layer disposed over the first MIM capacitor electrode; and
a second MIM capacitor electrode disposed over the insulator layer and comprising a second titanium nitride film having a second plurality of layers, wherein at least two layers of the second plurality of layers are titanium nitride layers, and wherein the at least two titanium nitride layers of the second plurality of layers have different crystallization patterns that prevent grain boundaries within the second titanium nitride film from extending along a height of the second titanium nitride film.

9. The integrated chip of claim 8,
wherein the first titanium nitride film further comprises a metal under-layer that is not titanium nitride and which is disposed between the semiconductor substrate and the first plurality of layers; or wherein the second titanium nitride film further comprises a metal under-layer that is not titanium nitride and which is disposed between the insulator layer and the second plurality of layers.

10. The integrated chip of claim 9, wherein the metal under-layer is titanium.

11. The integrated chip of claim 8,
wherein the first titanium nitride film further comprises a plurality of metal inter-layers not comprising titanium nitride which are interleaved between the first plurality of layers; or wherein the second titanium nitride film further comprises a plurality of metal inter-layers not comprising titanium nitride which are interleaved between the second plurality of layers.

12. The integrated chip of claim 11, wherein the plurality of metal inter-layers are titanium.

13. The integrated chip of claim 8, wherein the first titanium nitride film has a ratio of titanium to nitride that is greater than 1.03.

14. The integrated chip of claim 8, wherein the first titanium nitride film has a first plurality of grain boundaries, wherein the first plurality of grain boundaries comprise a first grain boundary separating a first vertical column-like structure within the first titanium nitride film from a second vertical column-like structure within the first titanium nitride film.

15. The integrated chip of claim 14, wherein the second titanium nitride film has a second plurality of grain boundaries, wherein the second titanium nitride film includes a second plurality of grain boundaries that are discontinuous with the first plurality of grain boundaries.

16. An integrated chip, comprising:
a first MIM capacitor electrode arranged over a substrate and comprising a first titanium nitride layer having a first plurality of grain boundaries vertically extending through the first titanium nitride layer, and a second titanium nitride layer contacting an upper surface of the first titanium nitride layer and having a second plurality of grain boundaries vertically extending through the second titanium nitride layer, wherein the first plurality of grain boundaries are discontinuous with the second plurality of grain boundaries;
an insulator layer disposed over the first MIM capacitor electrode; and
a second MIM capacitor electrode arranged over the insulator layer and comprising a third titanium nitride layer having a third plurality of grain boundaries vertically extending through the third titanium nitride layer, and a fourth titanium nitride layer contacting an upper surface of the third titanium nitride layer and having a fourth plurality of grain boundaries vertically extending through the fourth titanium nitride layer, wherein the third plurality of grain boundaries are discontinuous with the fourth plurality of grain boundaries.

17. The integrated chip of claim 16,
wherein the first titanium nitride layer comprises a first plurality of column-like structures laterally separated from one another by the first plurality of grain boundaries extending between an upper surface of the first titanium nitride layer and a lower surface of the first titanium nitride layer; and
wherein the second titanium nitride layer comprises a second plurality of column-like structures laterally separated from one another by the second plurality of grain boundaries extending between an upper surface of the second titanium nitride layer and a lower surface of the second titanium nitride layer.

18. The integrated chip of claim 16, further comprising:
a metal inter-layer arranged vertically between the first titanium nitride layer and the second titanium nitride layer.

19. The integrated chip of claim 18, wherein the metal inter-layer comprises aluminum or copper.

20. The integrated chip of claim 16, further comprising:
a metal under-layer in contact with a lower surface of the first titanium nitride layer at a position that is vertically between the substrate and the first titanium nitride layer.

* * * * *